United States Patent [19]

Namose

[11] Patent Number: 5,332,464
[45] Date of Patent: Jul. 26, 1994

[54] SEMICONDUCTOR DEVICE MANFUACTURING APPARATUS

[75] Inventor: Isamu Namose, Nagano, Japan

[73] Assignee: Seiko Epson Corporation, Tokyo, Japan

[21] Appl. No.: 10,167

[22] Filed: Jan. 28, 1993

Related U.S. Application Data

[62] Division of Ser. No. 774,850, Oct. 11, 1991, Pat. No. 5,200,016.

[30] Foreign Application Priority Data

Oct. 12, 1990 [JP] Japan .................................. 2-273623
Sep. 26, 1991 [JP] Japan .................................. 3-247302

[51] Int. Cl.$^5$ ............................................. H01L 21/00
[52] U.S. Cl. .................................... 156/626; 156/627; 156/643
[58] Field of Search ............... 156/626, 627, 345, 643; 118/723; 204/298.03, 298.06, 298.07, 298.32, 298.33, 298.34

[56] References Cited

U.S. PATENT DOCUMENTS 4,661,203  4/1987  Smith et al. ...................... 156/659.1
5,200,016  4/1993  Namose ............................... 156/345

FOREIGN PATENT DOCUMENTS 58-132932  8/1983  Japan .
59-40534   3/1984  Japan .
60-166030  8/1985  Japan .
62-123721  6/1987  Japan .
63-010523  1/1988  Japan .
426493     5/1991  Japan .

OTHER PUBLICATIONS

"Counter-Electrode Structure For Endpoint Detect"; Bondur et. al.; IBM Technical Disclosure; vol. 22, No. 10, Mar. 1980; pp. 4514–4515.

Primary Examiner—R. Bruce Breneman
Assistant Examiner—George Goudreau
Attorney, Agent, or Firm—Sughrue, Mion, Zinn, Macpeak & Seas

[57] ABSTRACT

In a semiconductor device manufacturing apparatus for performing an etching operation with a reaction gas, in which three electrodes, namely, upper, intermediate and lower electrodes, are arranged parallel to one another, and the intermediate electrode is in the form of a grid, having a number of through-holes, the axis of at least one of the through-holes in the intermediate electrode is inclined with respect to the central axis of the intermediate electrode. Accordingly, etching energy is uniformly applied to the entire surface of a material to be etched, thereby to achieve etching uniformly both in speed and in configuration.

1 Claim, 2 Drawing Sheets

SEMICONDUCTOR DEVICE MANFUACTURING APPARATUS

This is a divisional of Application No. 07/774,850 filed Oct. 11, 1991 U.S. Pat. No. 5,200,016.

BACKGROUND OF THE INVENTION

The present invention relates to a method of detecting the end of an etching operation of electrodes of a three-electrode type dry etching unit with a detecting section of an optical end point detecting unit.

A conventional semiconductor device manufacturing apparatus, as shown in FIG. 4(a), has an intermediate electrode 4 having a plurality of vertical through-holes 5. Of those lo vertical through-holes 5, the one on the straight line connecting a material to be etched and the detecting section 9 of an optical end point detecting unit 8 is made larger than the others to provide a sufficiently wide optical path, or made different in configuration from the others for the purpose of end point detection. In FIG. 4(a), reference numeral 1 designates a reaction chamber; 2, an upper electrode; 3, a lower electrode; 6, a high frequency power source; and 7, a wafer. The optical end point detecting unit 8 operates to detect with the detecting section 9 the intensity of plasma light due to an etching reaction, thereby to detect the end point of the etching.

The intermediate electrode 4, as shown in FIG. 4(b), is in the forth of a disk with the through-holes 5. In the conventional apparatus, the diameter of the through-hole 5 on the straight line connecting the material to be etched and the detecting section 9 of the optical end point detecting unit is four times as large as that of the remaining through-holes 5.

Such an apparatus was used to etch a silicon oxide film under conditions and characteristics which were typically as indicated in the following Table 1:

TABLE 1

| Gas | |
|---|---|
| $CHF_3$ | 100 SCCM |
| $C_2F_6$ | 40 SCCM |
| Vacuum pressure | 200 mTorr |
| RF power | 800 watts |
| Etching speed | 820 Å/min |
| Uniformity | 7.2% |

The above-described conventional semiconductor device manufacturing apparatus is, however, disadvantageous in the following points: As was described above, in order to provide a sufficiently wide optical path on the straight line connecting a material to be etched and the detecting section 9 of the optical end point detecting unit 8, the corresponding through-hole 5 is made larger in diameter than the others, or it is made different in configuration from the others. Hence, the etching energy is not uniformly applied to the material to be etched, and accordingly the etching of the material is not uniform in speed and in configuration.

SUMMARY OF THE INVENTION

Accordingly, an object of this invention is to eliminate the above-described difficulties accompanying a conventional semiconductor device manufacturing apparatus.

More specifically, an object of the invention is to provide a method of detecting the end point of an etching operation performed by a three-electrode type dry etching apparatus based upon the intensity of the plasma light detected by an optical end point detecting unit.

The foregoing object and other objects of the invention have been achieved by applying the end point detecting method with a semiconductor device manufacturing apparatus including three-electrode type dry etching unit in which plasma is formed with a reaction gas introduced into a reaction chamber, and three electrodes, namely, upper, intermediate and lower electrodes, arranged parallel to one another, the intermediate electrode being in the form of a grid having a plurality of through-holes, in which at least one of the through-holes in the intermediate electrode is not oriented vertically nor horizontally with respect to the intermediate electrode.

In the intermediate electrode, the through-holes are arranged so that optical paths are formed parallel to the straight line connecting the material to be etched and the detecting section of the optical end point detecting unit.

The nature, utility and principle of the invention will be more clearly understood from the following detailed description and the appended claims when read in conjunction with the accompanying drawings.

DESCRIPTION OF THE PREFERRED EMBODIMENTS

Preferred embodiments of the invention will be described with reference to the accompanying drawings.

Figure 1:
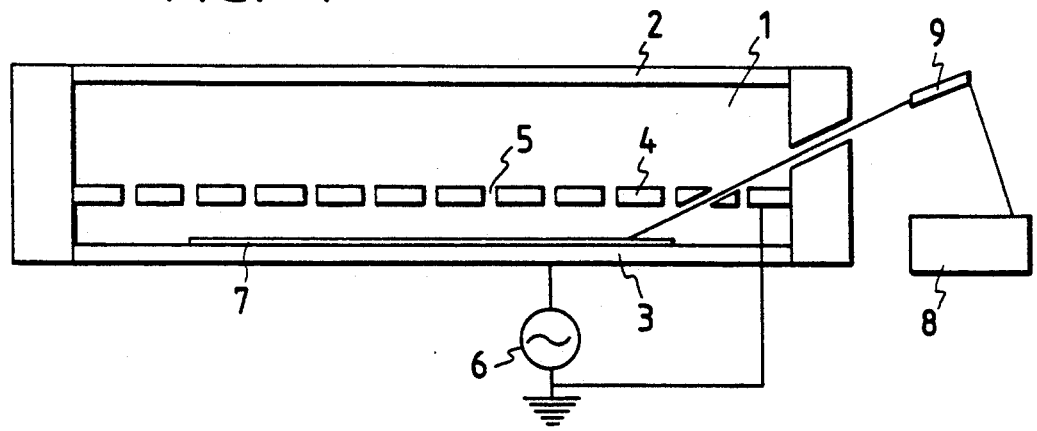
FIG. 1 is an explanatory diagram showing the construction of an example of a semiconductor of device manufacturing apparatus which constitutes a first embodiment of this invention.
Figure 4A:
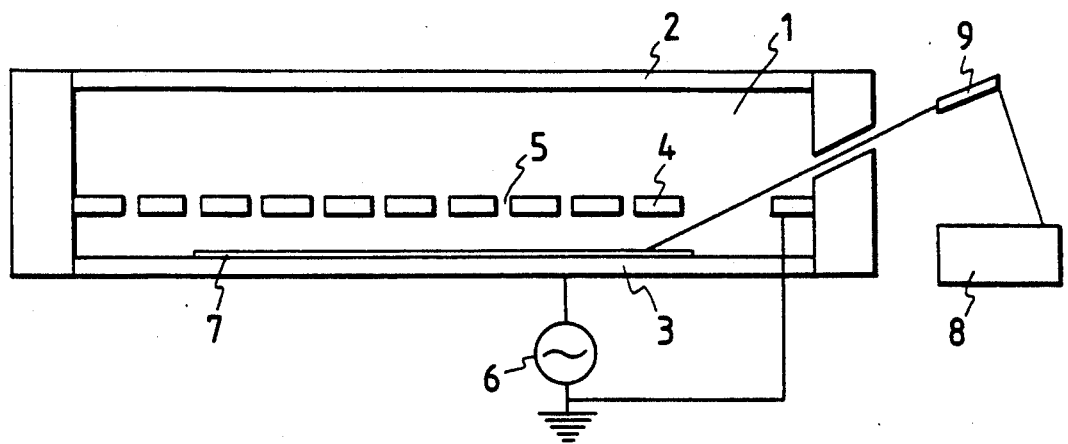
FIG. 4(a) is an explanatory diagram showing a conventional semiconductor device manufacturing apparatus.
Figure 4B:
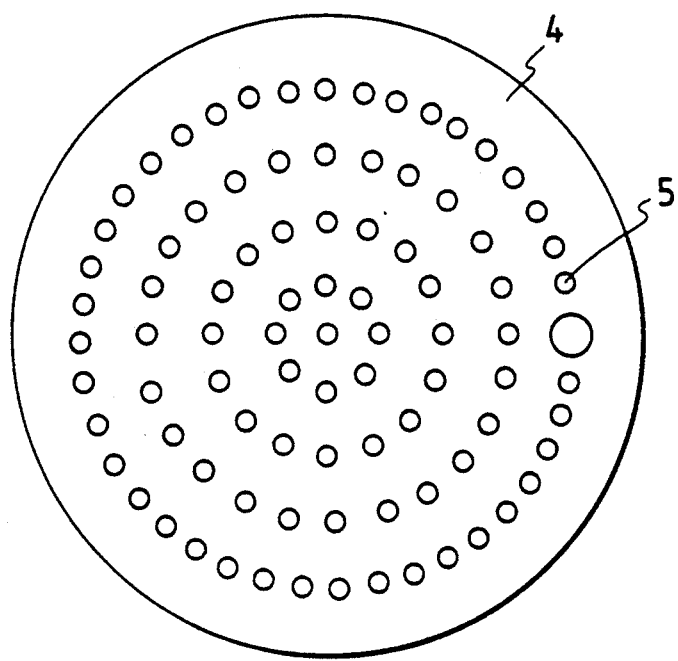
FIG. 4(b) is a plan view of an intermediate electrode in the conventional apparatus shown in FIG. 4(a).

An example of a semiconductor device manufacturing apparatus, as shown in FIG. 1, includes: a reaction chamber 1, an upper electrode 2, a lower electrode 3, an intermediate electrode 4, through-holes 5, a high frequency power source 6, a wafer 7, and an optical end point detecting unit 8 for use with a manufacturing device shown in FIG. 4(a). Of the through-holes 5, the one which is on the straight line connecting a material to be etched and the detecting section 9 of the optical end point detecting unit 8 is parallel to the straight line.

With the apparatus, a silicon oxide film was etched. In this case, the conditions and characteristics were as indicated in the following Table 2:

TABLE 2

| Gas | |
|---|---|
| $CHF_3$ | 100 SCCM |
| $C_2F_6$ | 40 SCCM |
| Vacuum pressure | 200 mTorr |
| RF power | 800 watts |
| Etching speed | 834 Å/min |

TABLE 2-continued

| Uniformity | 4.2% |

Figure 2:
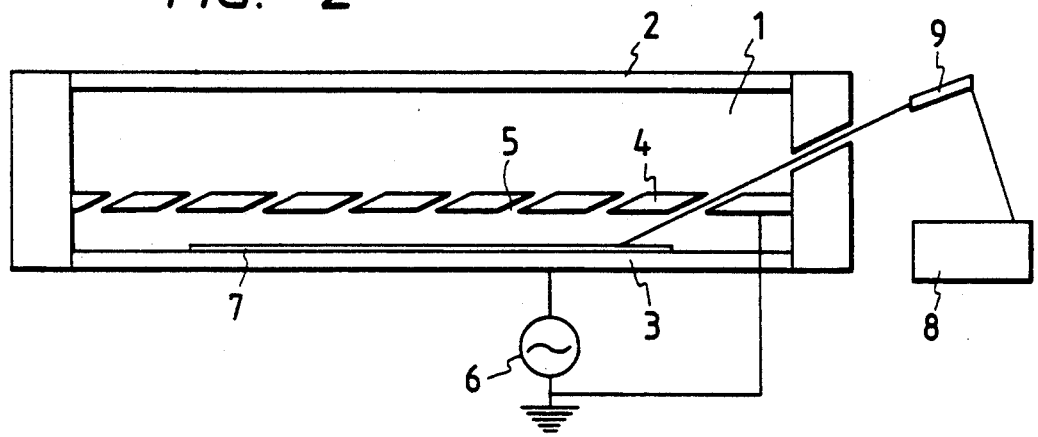
FIG. 2 is an explanatory diagram showing the construction of another example of the semiconductor device manufacturing apparatus which constitutes a second embodiment of the invention.

FIG. 2 shows another example of the semiconductor device manufacturing apparatus, utilized when applying the inventive method. As is apparent from a comparison of FIGS. 1 and 2, the apparatus in FIG. 2 employs the same components as in FIG. 1. However, it should be noted that in FIG. 2 the axes of all the through-holes 5 are parallel to the straight line connecting the material to be etched and the detecting section 9 of the optical end point detecting unit 8.

Similarly as in the apparatus in FIG. 1, embodiment, a silicon oxide film was etched with the above apparatus. In this case, the conditions and characteristics were as indicated in the following Table 3:

TABLE 3

| Gas | |
|---|---|
| $CHF_3$ | 100 SCCM |
| $C_2F_6$ | 40 SCCM |
| Vacuum pressure | 200 mTorr |
| RF power | 800 watts |
| Etching speed | 842 Å/min |
| Uniformity | 2.5% |

As is seen from Table 3, the uniformity was remarkably improved by inclining the axes of the through-holes 5 in the intermediate electrode 4. In addition, this arrangement substantially prevent the particles formed between the upper electrode 2 and the intermediate electrode 4 from dropping onto the material to be etched.

In the above-described devices, a silicon oxide film was etched; however, the invention is not limited thereto or thereby. That is, by changing the reaction gas, the etching operation can be carried out in various manners with the same effects.

Figure 3:
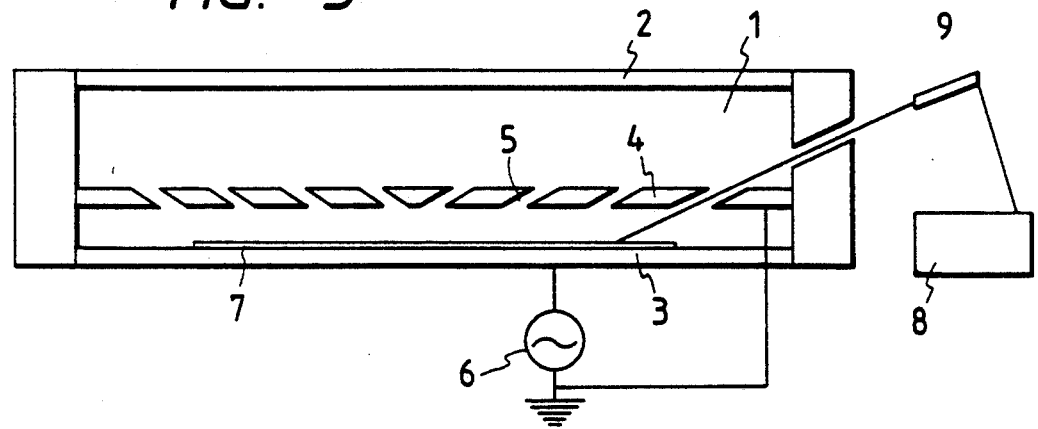
FIG. 3 is an explanatory diagram showing a modification of the apparatus shown in FIG. 2.

FIG. 3 shows a modification of the semiconductor device manufacturing apparatus shown in FIG. 2. The semiconductor device manufacturing apparatus shown in FIG. 3 is different from the apparatus of FIG. 2 in the construction of the through-holes 5. That is, the axes of all the through-holes 5, including the one on the straight line connecting the material to be etched and the detecting section 9 of the optical end point detecting unit 8, are inclined forming a certain angle with respect to the central axis of the intermediate electrode, that is, an imaginarily line passing through the center of the intermediate electrode and perpendicular to the plane of the intermediate electrode. Hence, the optical end point detecting unit can be set at a plurality of desired positions.

The optical end point detecting unit may be such that the end point of an etching operation is detected from the intensity of plasma light due to the etching reaction, or from a laser interference beam reflected from the material to be etched when a laser beam is externally applied thereto.

As described above, in the semiconductor device manufacturing apparatus, through-holes are formed in the intermediate electrode in such a manner that the axes of the through-holes are parallel to a straight line connecting the material to be etched and the detecting section of the optical end point detecting unit. As a result, the etching energy can be uniformly applied between the intermediate electrode and the material to be etched; that is, the etching energy can be uniformly applied to the entire surface of the material to be etched, as a result of which the etching of the material is uniform both in speed and in configuration.

Because through-holes in the intermediate electrodes are inclined, even if particles are formed between the upper electrode and the intermediate electrode during etching, the particles scarcely drop on the material to be etched.

While preferred embodiments of the invention have been described, it will be obvious to those skilled in the art that various changes and modifications may be made without departing from the invention, and it is aimed, therefore, to cover in the appended claims all such changes and modifications as fall within the true spirit and scope of the invention.

What is claimed is:

1. A method of detecting an end point of an etching operation of a three-electrode type dry etching apparatus comprising an upper electrode, an intermediate electrode and a lower electrode arranged parallel to one another, said intermediate electrode having at least one hole which has a central axis neither perpendicular nor parallel to a central axis of said intermediate electrode, and wherein said at least one hole extends along a straight line connecting a material to be etched and a detection section of an optical end point detecting device so as to be parallel to an optical path, said method comprising the steps of:

performing said etching operation on sad material to be etched with said three-electrode type dry etching apparatus;

detecting an intensity of plasma light generated from an etching reaction through said at least one hole during said etching operation; and determining said end point of said etching operation based upon said intensity of plasma light detected by said detecting section of said optical end point detecting device.

* * * * *